(12) United States Patent
Kluth et al.

(10) Patent No.: US 6,410,388 B1
(45) Date of Patent: Jun. 25, 2002

(54) PROCESS FOR OPTIMIZING POCKET IMPLANT PROFILE BY RTA IMPLANT ANNEALING FOR A NON-VOLATILE SEMICONDUCTOR DEVICE

(75) Inventors: George Jonathan Kluth, Sunnyvale, CA (US); Stephen K. Park, Austin, TX (US); Arvind Halliyal, Sunnyvale; David K. Foote, San Jose, both of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/620,480

(22) Filed: Jul. 20, 2000

Related U.S. Application Data

(60) Provisional application No. 60/182,612, filed on Feb. 15, 2000.

(51) Int. Cl.[7] .............................................. H01L 21/336
(52) U.S. Cl. ........................ 438/257; 438/555; 438/301
(58) Field of Search .................................. 438/257, 555, 438/545, 527, 301, 306

(56) References Cited

U.S. PATENT DOCUMENTS 6,121,666 A * 9/2000 Burr ............................ 257/408
6,255,174 B1 * 7/2001 Yu ............................... 438/286

FOREIGN PATENT DOCUMENTS

EP          1091418          * 4/2001

* cited by examiner

Primary Examiner—Caridad Everhart
(74) Attorney, Agent, or Firm—Amin & Turocy, LLP

(57) ABSTRACT

A process for fabricating a memory cell in a two-bit EEPROM device, includes forming an ONO layer overlying a semiconductor substrate, depositing a resist mask overlying the ONO layer, patterning the resist mask, implanting the semiconductor substrate with a p-type dopant, wherein the resist mask is used as an ion implant mask, and annealing the semiconductor substrate before implanting the semiconductor substrate with an n-type dopant. In one preferred embodiment, the annealing of the semiconductor substrate laterally diffuses the p-type dopants to form pocket regions on either side of the EEPROM device.

18 Claims, 2 Drawing Sheets

PROCESS FOR OPTIMIZING POCKET IMPLANT PROFILE BY RTA IMPLANT ANNEALING FOR A NON-VOLATILE SEMICONDUCTOR DEVICE

This application claims priority from provisional application No. 60/182,612, filed Feb. 15, 2000.

FIELD OF THE INVENTION

This invention relates, generally, to processes for fabricating semiconductor devices and, more particularly, to processes for fabricating non-volatile semiconductor devices, such as electrically-erasable-programmable-read-only memory (EEPROM) devices.

BACKGROUND OF THE INVENTION

Non-volatile memory devices are currently in widespread use in electronic components that require the retention of information when electrical power is terminated. Non-volatile memory devices include read-only-memory (ROM), programmable-read-only-memory (PROM), erasable-programmable-read-only-memory (EPROM), and electrically-erasable-programmable-read-only memory (EEPROM) devices. EEPROM devices differ from other non-volatile memory devices in that they can be electrically programmed and erased. Flash EEPROM devices are similar to EEPROM devices in that memory cells can be programmed and erased electrically. However, Flash EEPROM devices enable the erasing of all memory cells in the device using a single electrical current pulse.

Typically, an EEPROM device includes a floating-gate electrode upon which electrical charge is stored. The floating-gate electrode overlies a channel region residing between source and drain regions in a semiconductor substrate. The floating-gate electrode together with the source and drain regions forms an enhancement transistor. By storing electrical charge on the floating-gate electrode, the threshold voltage of the enhancement transistor is brought to a relatively high value. Correspondingly, when charge is removed from the floating-gate electrode, the threshold voltage of the enhancement transistor is brought to a relatively low value. The threshold level of the enhancement transistor determines the current flow through the transistor when the transistor is turned on by the application of appropriate voltages to the gate and drain. When the threshold voltage is high, no current will flow through the transistor, which is defined as a logic 0 state. Correspondingly, when the threshold voltage is low, current will flow through the transistor, which is defined as a logic 1 state.

Non-volatile memory designers have taken advantage of the ability of silicon nitride to store charge in localized regions and have designed memory circuits that utilize two regions of stored charge within the ONO layer. This type of non-volatile memory device is known as a two-bit EEPROM. The two-bit EEPROM is capable of storing twice as much information as a conventional EEPROM in a memory array of equal size. A left and right bit is stored in physically different areas of the silicon nitride layer, near left and right regions of each memory cell. Programming methods are then used that enable two-bits to be programmed and read simultaneously. The two-bits of the memory cell can be individually erased by applying suitable erase voltages to the gate and to either the source or drain regions.

While the recent advances in EEPROM technology have enabled memory designers to double the memory capacity of EEPROM arrays using two-bit data storage, numerous challenges exist in the fabrication of material layers within these devices. In particular, fabricating the p-type and n-type regions within a memory cell presents several challenges. Sometimes, in the fabrication of a memory cell, an ONO layer is formed having a first silicon dioxide layer overlying the semiconductor substrate, a silicon nitride layer overlying the first silicon dioxide layer, and a second silicon dioxide layer overlying the silicon nitride layer. A layer of photoresist is then spun on the ONO layer. The photoresist is patterned into a resist mask and the semiconductor substrate is doped with a p-type dopant, such as boron, using ion implantation at a large angle of incidence relative to the principal surface of the semiconductor substrate to allow the p-type dopant implant to be located away from a subsequent n-type dopant. The wafer is then rotated 180° and the semiconductor substrate is doped a second time with a p-type dopant using ion implantation at a large angle of incidence relative to the principal surface of the semiconductor substrate. Doping the semiconductor substrate with a p-type dopant creates p-type regions. The semiconductor substrate is then doped with an n-type dopant such as arsenic using ion implantation at an angle substantially normal to the principal surface of the semiconductor substrate. Doping the semiconductor substrate with n-type dopants creates n-type regions. Typically, the ONO layer is etched before the semiconductor substrate is doped with n-type dopants in order to make the implant of n-type dopants a more controlled implant. Once the n-type dopants have been implanted in the semiconductor substrate, the resist mask is stripped and cleaned from the ONO layer and a bit-line oxide region is thermally grown onto the semiconductor substrate.

There are several problems that occur with the above-described prior art method for fabricating a memory cell. One problem is that the resist mask has to meet two conflicting requirements: the resist mask has to be thin enough to accommodate the large angle of incidence of the p-type dopant implant, and yet the resist mask has to be thick enough to withstand the n-type dopant implant. If the resist mask is too thick, the p-type dopant implant must be made with a smaller angle of incidence, however if the resist mask is too thin the n-type dopant implant cannot be made at all because the resist mask would have been too heavily degraded. Accordingly, advances in memory cell fabrication technology are necessary to insure patterning of high density memory cells used in two-bit EEPROM devices.

BRIEF SUMMARY

The present invention is for a process for fabricating a memory cell in a two-bit EEPROM device. Fabrication of a two-bit EEPROM device requires the formation of p-type regions and n-type regions with good critical dimension control. This is because proper functionality of the two-bit EEPROM device during a programming operation requires voltages to be applied to the p-type regions and n-type regions. In particular, the p-type regions must be positioned at the edges of the ONO layer for fabrication of high density devices. By fabricating a high quality memory cell using an annealing operation to laterally diffuse the p-type dopant, a high-density two-bit EEPROM device with good critical dimensions control can be manufactured.

In one form, a process for fabricating a memory cell includes providing a semiconductor substrate and forming an ONO layer over the semiconductor substrate. The semiconductor substrate is then preferably doped with a p-type dopant such as boron. Preferably, the p-type dopant implant is a direct implant, which is an implant at an angle substantially normal with respect to the principal surface of the semiconductor substrate. After doping the semiconductor substrate with p-type dopants, the semiconductor substrate is annealed, preferably in a rapid thermal annealing system at a temperature of about 900° C. to about 1050° C. During the annealing process the p-type dopant is laterally diffused so that some of the p-type dopant is below the ONO layer. After the annealing process, the semiconductor substrate is doped with an n-type dopant such as arsenic, preferably by using ion implantation. The doping of the semiconductor substrate with an n-type dopant causes n-type regions to form in the semiconductor substrate. The n-type dopant forces the p-type dopant to the p-type regions under and near the edges of the ONO layer. The annealing step prior to implanting the n-type dopant laterally diffuses the p-type dopant for the formation of pocket regions and removes the need for an angled implant and the problems associated with an angled implant. By avoiding the angled implant, the annealing step allows for the fabrication of a memory cell with tighter critical dimensions.

Figure 1:
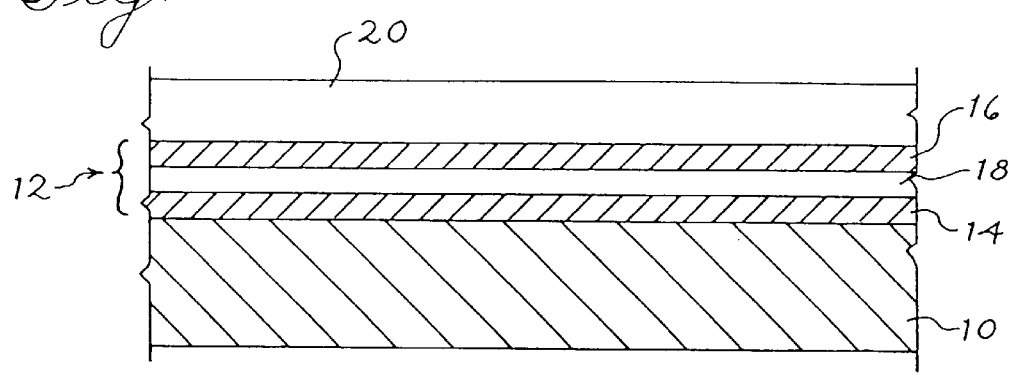
FIGS. 1–6 illustrate, in cross-section, processing steps in accordance with the invention.

It should be appreciated that, for simplicity and clarity of illustration, elements shown in the Figures have not necessarily been drawn to scale. For example, the dimensions of some of the elements are exaggerated relative to others for clarity. Further, where considered appropriate, reference numerals have been repeated among the Figures to indicate corresponding elements.

DETAILED DESCRIPTION OF PREFERRED EMBODIMENTS

Figure 2:
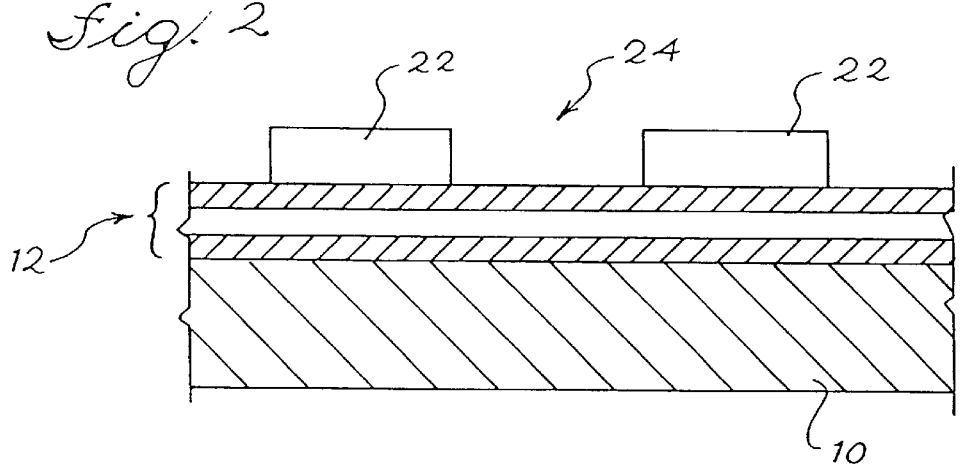
Figure 3:
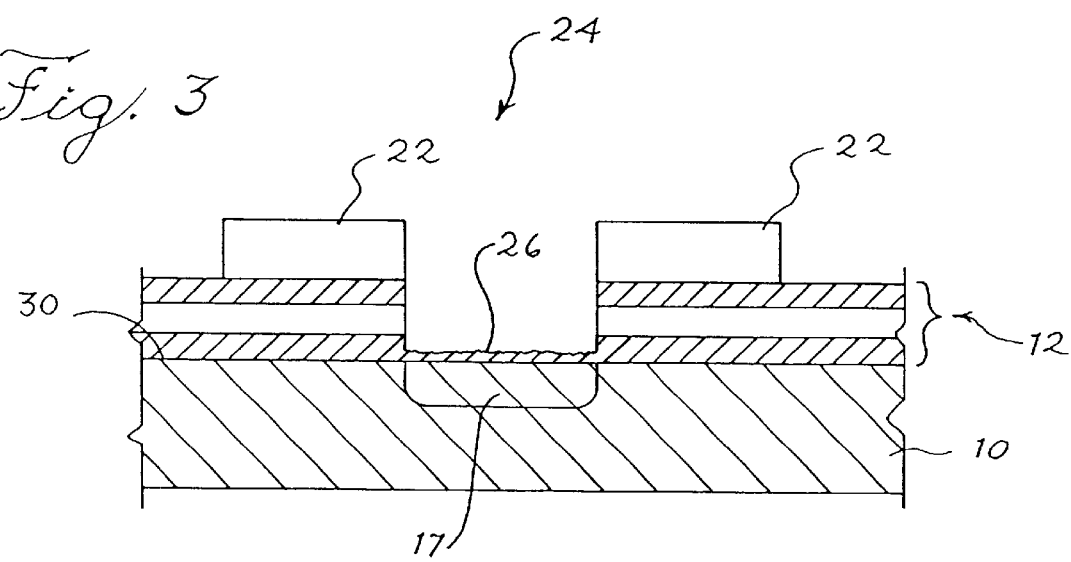

Shown in FIG. 1, in cross-section is a portion of a semiconductor substrate 10 having already undergone several processing steps in accordance with the invention. An ONO layer 12 overlies semiconductor substrate 10 and includes a first oxide layer 14, a second oxide layer 16 and a silicon nitride layer 18 sandwiched between the first oxide layer 14 and second oxide layer 16. A resist layer 20 overlies ONO layer 12. Resist layer 20 can be one of a number of different types of resist, including optical photoresist responsive to visible and near UV light, deep UV resist and the like. Alternatively, resist layer 20 can be an inorganic resist layer, an X-ray resist layer and the like. In a preferred embodiment, resist layer 20 is a Novolak resin photoresist material.

accordance with the invention, resist layer 20 is exposed to radiation of the appropriate wavelength and developed to form a resist pattern 22 overlying ONO layer 12, as illustrated in FIG. 2. Resist pattern 22 is formed to have a predetermined geometric configuration for the fabrication of buried bit-line regions in semiconductor substrate 10. Resist pattern 22 exposes selected regions 24 of semiconductor substrate 10. Once resist pattern 22 is formed, an implantation process is carried out over exposed selected regions 24 at an angle substantially normal to the surface of the semiconductor substrate 10, as illustrated in FIG. 3. In a preferred embodiment, a p-type dopant, such as boron, is ion implanted into semi-conductor substrate 10 at a junction depth of $y_{j1}$ 17.

Figure 4:
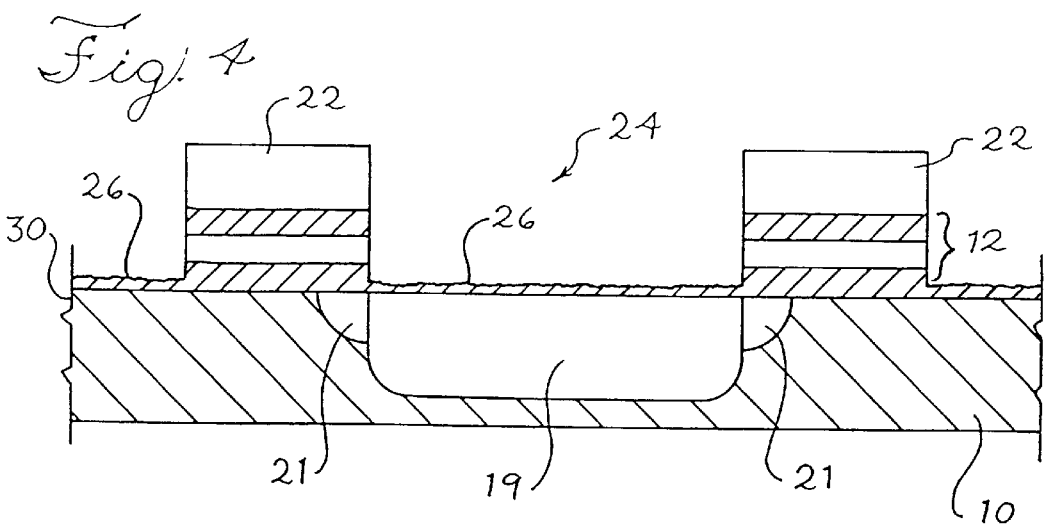

After implantation of a p-type dopant, resist layer 22 is removed and an annealing process is carried out to laterally diffuse the boron implant in order to create boron pocket regions 21, as illustrated in FIG. 4. Preferably the annealing process is carried out at a temperature of about 900° C. to about 1050° C. Further, the annealing process can be carried out in either a convection furnace or, alternatively, in a rapid thermal annealing system. In a preferred embodiment of the invention, the annealing process is carried out in a rapid thermal annealing system having an inert gas ambient, such as nitrogen, argon and the like. In either a convection furnace or a rapid thermal annealing system, the annealing process is carried out for an amount of time sufficient to laterally diffuse the boron implant a distance x from the original exposed region 24.

Figure 5:
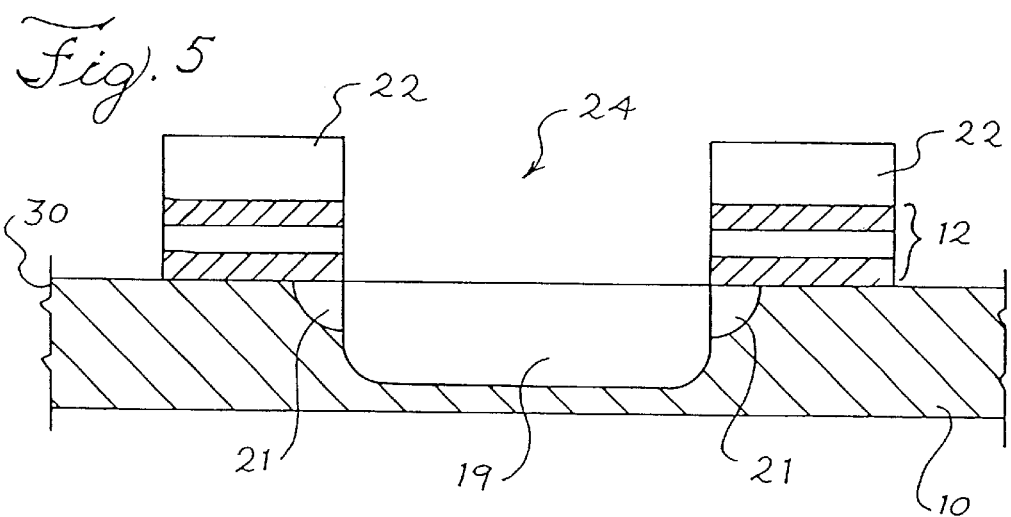

Referring to FIG. 5, after laterally diffusing the boron, resist pattern 22 is realigned onto ONO layer 12 exposing selected regions 24 of semiconductor 5 substrate 10. Then, portions of ONO layer 12 exposed by resist pattern 22 are etched to expose principal surface 30 of semiconductor substrate 10. Preferably, resist pattern 22 is used as an etching mask, such that the etching process exposes principal surface 30 in selected regions 24 defined by resist mask 22. In a preferred embodiment, ONO layer 12 is anisotropically etched, such that ONO layer 12 and resist pattern 22 have continuous, substantially vertical sidewalls.

Once the etching process is complete, preferably a doping process is carried out to form a buried bit-line 32 in selected region 24 of semiconductor substrate 10. Preferably, an n-type dopant, such as arsenic, is ion implanted at an angle of incidence substantially normal to principal surface 30 of semiconductor substrate 10. Preferably, buried bit line region 32 is formed by the ion implantation of arsenic using a dose of about 3E15 to about 5E15 ions per square centimeter. The implantation of arsenic pushes the boron away from selected region 24 creating pocket regions 36. The ion implantation energy is selected so as to form buried bit-line region 32 to a selected junction depth $y_{j2}$ in semiconductor substrate 10. Preferably, the ion implantation energy is of sufficient magnitude, such that the junction depth $y_{j2}$ of buried bit-line region 32 is less than the junction depth $y_{j1}$ of pocket part regions 36.

Figure 6:
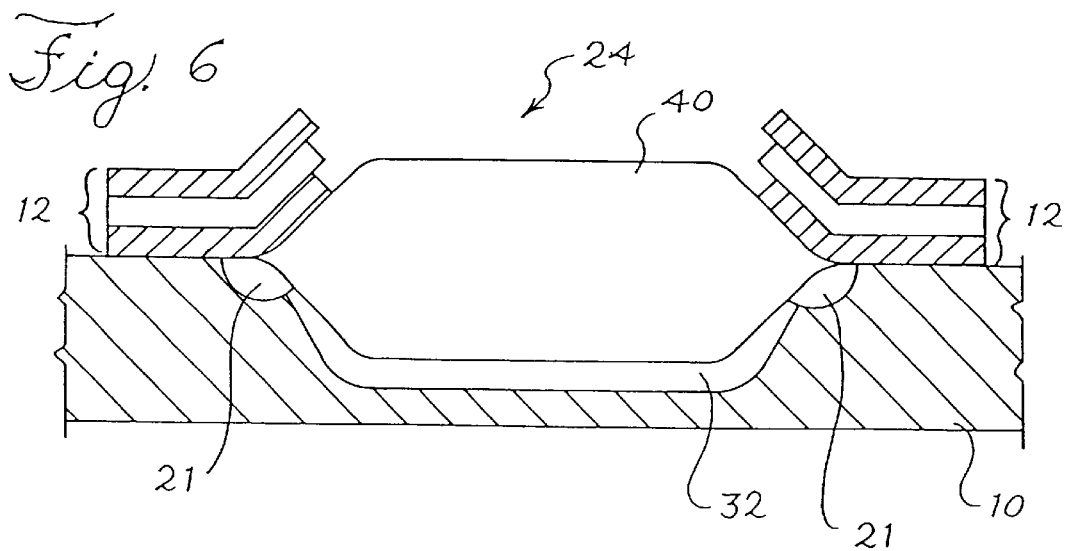

The process of the invention continues, as illustrated in FIG. 6, with the removal of resist pattern 22 and the formation of a bit-line oxide layer 40. In a preferred embodiment, bit-line oxide layer 40 is formed by thermal oxidation of semiconductor substrate 10 using ONO layer 12 as an oxidation mask. ONO layer 12, having been previously patterned by the etching process described above, exposes selected regions 24 of semiconductor substrate 10. During the preferred oxidation process, the patterned portions of ONO layer 12 prevent the oxidation of semiconductor substrate 10 in region underlying ONO layer 12. Accordingly, bit-line oxide layer 40 is confined to selected regions 24 of semiconductor substrate 10. Upon completion of the oxidation process, bit-line layer 40 overlies buried bit-line region 32 in semiconductor substrate 10.

Thus, it is apparent that there has been described, in accordance with the invention, a process for fabricating a buried bit-line in a non-volatile semiconductor device that fully provides the advantages set forth above. Although the invention has been described and illustrated with reference to specific, illustrative embodiments thereof, it is not intended that the invention be limited to those illustrative embodiments. Those skilled in the art will recognize that variations and modifications can be made without departing from the spirit of the invention. For example, the conductivity of the doping processes and the substrate can be reversed from that described above. Accordingly, the pocket regions can be formed to have an n-type conductivity, and the buried bit-line region can be formed to have a p-type conductivity. It is, therefore, intended to include within the invention all such variations and modifications as fall within the scope of the appended claims and equivalents thereof.

What is claimed is:

1. A process for fabricating a non-volatile semiconductor device comprising:

provide a substrate having a principal surface;

forming an ONO layer overlying the principal surface;

implanting boron into the substrate at an implant angle substantially normal to the principal surface;

annealing the substrate at a temperature from about 900° C. to about 1050° C. to laterally diffuse the boron and form a boron pocket region in the substrate having a first junction depth; and implanting an n-type dopant to form a n-type region in the substrate to a second junction depth, wherein the second junction depth is less than the first junction depth.

2. The process of claim 1, wherein annealing the substrate comprises annealing in a convection furnace.

3. The process of claim 1, wherein annealing the substrate comprises annealing in a rapid thermal annealing apparatus.

4. The process of claim 1, further comprising oxidizing the substrate to form a bit-line oxide region overlying the n-type region.

5. The process of claim 4, further comprising forming a control gate electrode overlying the ONO layer and located adjacent to the bit-line oxide region.

6. A process for fabricating a non-volatile semiconductor device comprising:

providing a substrate having a principal surface;

forming a patterned ONO layer thereon,
wherein the patterned layer has first and second edges separated by an opening in the patterned layer;

introducing a dopant of a first conductivity type into the substrate using the patterned layer as a first doping mask,
wherein the first dopant is introduced at a normal angle of incidence relative to the principal surface;

laterally diffusing the first dopant, such that a portion of the first dopant underlies the first and second edges of the patterned layer,
wherein the first dopant is diffused to a first junction depth; and introducing a second dopant of a second conductivity type using the patterned layer as a doping mask,
wherein the second dopant has a second junction depth, and
wherein the second junction depth is less than the first junction depth.

7. The process of claim 6 further comprising oxidizing the substrate to form an oxide region in a portion of the principal surface exposed by the opening in the patterned layer.

8. The process of claim 6, wherein introducing a first dopant comprises implanting boron into the substrate.

9. The process of claim 8, wherein introducing a second dopant comprises ion implanting an n-type dopant into the substrate.

10. The process of claim 6, wherein forming a patterned layer comprises:

forming a dielectric layer overlying the substrate; and forming a resist layer overlying the dielectric layer.

11. The process of claim 10, further comprising removing the resist layer prior to laterally diffusing the first dopant.

12. The process of claim 10 further comprising forming a gate electrode overlying the dielectric layer adjacent to the oxide region.

13. A process for fabricating a non-volatile semiconductor device comprising:

providing a semiconductor substrate having a principal surface;

forming a ONO layer overlying the substrate;

implanting boron into the substrate at an angle substantially normal to the principal surface;

annealing the substrate at a temperature from about 900° C. to about 1050° C. to laterally diffuse the boron and to form pocket regions in the substrate;

forming a bit-line region in the substrate; and forming a bit-line oxide layer overlying the bit-line region.

14. The process of claim 13, wherein annealing comprises annealing in a rapid thermal annealing system.

15. The process of claim 13, wherein forming a bit-line region comprises implanting an n-type dopant into the substrate.

16. The process of claim 13, wherein forming pocket regions comprises ion implanting a p-type dopant to a first junction depth.

17. The process of claim 13, wherein forming a bit-line region comprises ion implanting an n-type dopant to a second junction depth.

18. The process of claim 17, wherein the second junction depth is less than the first junction depth.

* * * * *